(12) United States Patent
Ding et al.

(10) Patent No.: US 9,503,106 B1
(45) Date of Patent: Nov. 22, 2016

(54) FREQUENCY-LOCKED VOLTAGE REGULATED LOOP

(71) Applicant: GLOBALFOUNDRIES INC., Grand Cayman (KY)

(72) Inventors: Hanyi Ding, Colchester, VT (US); Kai Di Feng, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/966,881

(22) Filed: Dec. 11, 2015

(51) Int. Cl.
*H03L 7/06* (2006.01)
*H03L 7/099* (2006.01)
*H03L 7/08* (2006.01)
*H03L 7/197* (2006.01)

(52) U.S. Cl.
CPC .............. *H03L 7/099* (2013.01); *H03L 7/0805* (2013.01); *H03L 7/197* (2013.01)

(58) Field of Classification Search
USPC .................................. 327/147–149, 156–158
See application file for complete search history.

(56) References Cited

U.S. PATENT DOCUMENTS

| 6,130,602 | A * | 10/2000 | O'Toole | H03L 7/0995 |
| | | | | 340/10.33 |
| 7,560,916 | B2 | 7/2009 | Zeng et al. | |
| 2009/0033382 | A1* | 2/2009 | Lesso | H03L 7/18 |
| | | | | 327/156 |
| 2012/0313678 | A1* | 12/2012 | Felix | H03L 5/00 |
| | | | | 327/156 |
| 2013/0063194 | A1* | 3/2013 | Schlachter | H03K 19/177 |
| | | | | 327/158 |
| 2013/0093526 | A1* | 4/2013 | Ravinuthula | H03K 3/013 |
| | | | | 331/57 |
| 2015/0002195 | A1* | 1/2015 | Englekirk | H03L 7/0891 |
| | | | | 327/157 |
| 2015/0002197 | A1* | 1/2015 | Chatterjee | H03L 7/095 |
| | | | | 327/159 |
| 2016/0164529 | A1* | 6/2016 | Nakamura | H03L 7/02 |
| | | | | 327/158 |

OTHER PUBLICATIONS

Abdelouahab Djemouai et al., "New Frequency-Locked Loop Based on CMOS Frequency-to-Voltage Converter: Design and Implementation" IEEE Transactions on Circuits and Systems—II: Analog and Digital Signal Processing, vol. 48, No. 5, May 2001, pp. 441-449.

* cited by examiner

*Primary Examiner* — Adam Houston
(74) *Attorney, Agent, or Firm* — Gibb & Riley, LLC; Anthony J. Canale (57) ABSTRACT

An integrated circuit includes a frequency-locked voltage regulated loop that further includes a voltage controlled oscillator (VCO), a frequency divider that generates sequential timing signals based on a period of the VCO from a frequency divided VCO signal, a frequency-to-voltage converter (FVC) that converts the frequency divided VCO signal into an output voltage, $FVC_{OUT}$, an internal reference voltage, and a voltage regulator that generates a control voltage, $VCO_{IN}$, that is fed back to the VCO to lock a frequency of the VCO in the frequency-locked voltage regulated loop.

20 Claims, 6 Drawing Sheets

US 9,503,106 B1

FREQUENCY-LOCKED VOLTAGE REGULATED LOOP

BACKGROUND

Field of the Invention

The present disclosure relates to an integrated circuit chip that includes circuitry producing a frequency-locked output without an off-chip input reference component, such as a crystal oscillator or other type of reference signal circuitry. The integrated circuit may include a frequency-locked voltage regulated loop including a voltage-controlled oscillator (VCO) that is regulated by a voltage regulator, which receives an internal accurate reference voltage and adjusts the VCO's output frequency to the locked frequency.

Description of Related Art

Phase-locked loops (PLLs) are widely used in radio, telecommunications, computers and other electronic applications. They can be used to demodulate a signal, recover a signal from a noisy communication channel, generate a stable frequency at multiples of an input frequency, or distribute precisely timed clock pulses in digital logic circuits such as microprocessors.

Figure 1:
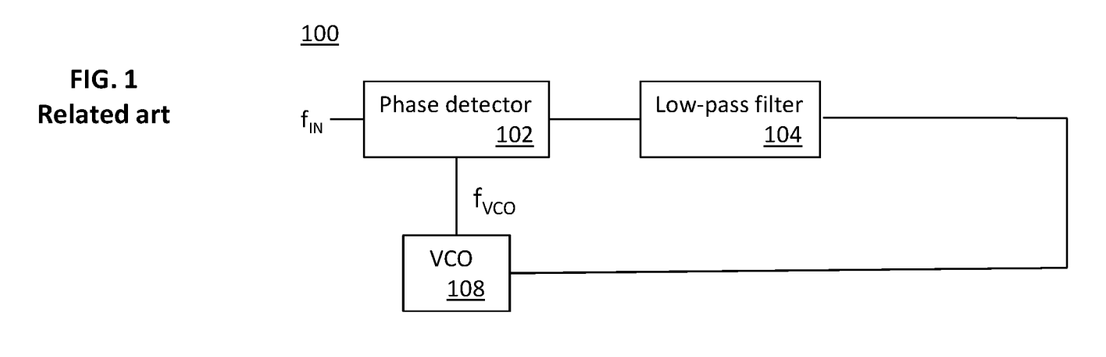
FIG. 1 is a schematic diagram illustrating a phase-locked loop in the related art.

Referring to FIG. 1, a phase-locked loop (PLL) 100 is a closed-loop system that generates an output signal, $f_{VCO}$, whose phase is related to the phase of an input frequency reference, $f_{IN}$. Typically an off-chip stable crystal oscillator provides the stable input frequency reference, $f_{IN}$. The phase-locked loop 100 includes a phase detector 102, a low pass filter 104, and a voltage-controlled oscillator (VCO) 108. The phase detector 102 compares two input frequencies, $f_{IN}$ and $f_{VCO}$, and generates an output that is a measure of their phase difference. If $f_{IN}$ does not equal $f_{VCO}$, the phase-error signal produced by the phase detector 102, after being filtered, is fed back to the VCO 110, causing the VCO frequency to change in the direction of $f_{IN}$.

Figure 2:
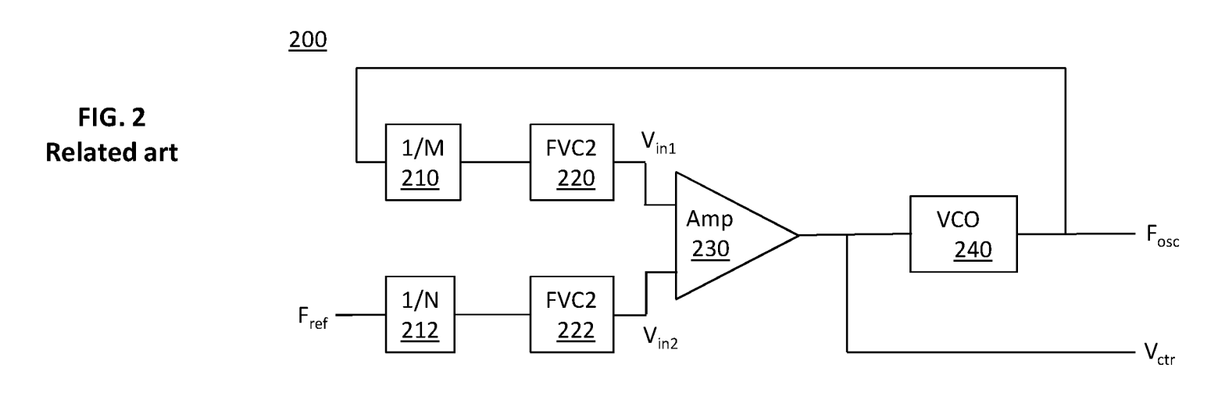
FIG. 2 is a schematic diagram illustrating a CMOS fully integrated frequency-locked loop using an external frequency reference in the related art.

Referring to FIG. 2, a CMOS fully integrated frequency-locked loop (FLL) 200 includes a negative feedback circuit including two frequency-to-voltage converters (FVCs) 220, 222, a voltage controlled oscillator (VCO) 240, a high-gain operational amplifier 230, and two frequency dividers per M and per N, 210, 212. The feedback loop includes the divider per M 210, FVC2 220, operational amplifier 230, and VCO 240. Operationally, the frequency of the input reference signal ($F_{ref}$), which is generated externally to the integrated frequency-locked loop 200, is divided by N and converted to a voltage ($V_{in1}$) by the FVC1 212. Similarly, the VCO oscillating frequency ($F_{osc}$) is divided by M and converted to a voltage ($V_{in2}$) by the FVC2 210. The high-gain operational amplifier 230 amplifies the difference between $V_{in1}$ and $V_{in2}$, and the resulting output voltage ($V_{ctr}$) is employed to control the output frequency of the VCO 240. Since $V_{in1}$ and $V_{in2}$ correspond to $F_{ref}$ and $F_{osc}$, respectively, the FVC1 222 and FVC2 220 together with the operational amplifier 230 act as an analog frequency comparator. Depending on the voltage difference between $V_{in1}$ and $V_{in2}$, the operational amplifier output voltage $V_{ctr}$ will increase or decrease the VCO oscillating voltage frequency $F_{osc}$ until the voltage $V_{in2}$ becomes equal to the voltage $V_{in1}$. At the time when $V_{in2}$ reaches $V_{in1}$, the output voltage $V_{ctr}$ ceases to vary and keeps the VCO 240 oscillating at a constant frequency. This integrated frequency-locked loop 200, however, requires an input reference frequency, $F_{ref}$, that is generated externally.

There remains a need for an integrated circuit chip that includes a frequency-locked loop and does not require an off-chip reference component.

SUMMARY

In an embodiment of the disclosure, an integrated circuit includes a frequency-locked voltage regulated loop without an off-chip input reference component, such as a crystal oscillator, or other type of reference signal circuitry. The frequency-locked voltage regulated loop includes: a voltage controlled oscillator (VCO) that outputs a VCO signal; a frequency divider, connected to the VCO, that generates sequential timing signals based on a period of the VCO signal from a frequency divided VCO signal; a frequency-to-voltage converter (FVC), connected to the frequency divider, that converts the frequency divided VCO signal into an output voltage, $FVC_{OUT}$, during a $1^{st}$ timing period; an internal reference voltage, $V_{ref}$, connected to the FVC and a voltage regulator; and the voltage regulator, also being connected to the frequency divider, the FVC and the VCO, generating a control voltage, $VCO_{IN}$, that is fed back to the VCO in a $2^{nd}$ timing period to lock a frequency of the VCO in the frequency-locked voltage regulated loop.

In another embodiment of the disclosure, an integrated circuit chip includes a frequency-locked voltage regulated loop without an off-chip input reference component, such as a crystal oscillator, or other type of reference signal circuitry. The frequency-locked voltage regulated loop includes: a voltage controlled oscillator (VCO) that outputs a VCO signal; a frequency divider, connected to the VCO, that generates a frequency divided VCO signal; a frequency-to-voltage converter (FVC), connected to the frequency divider, that converts the lower frequency divided VCO signal into an output voltage, $FVC_{OUT}$; an internal reference voltage, $V_{ref}$, connected to the FVC and a voltage regulator; and the voltage regulator, also being connected to the frequency divider, the FVC and the VCO, generating a control voltage, $VCO_{IN}$, that is based on a difference between $FVC_{OUT}$ and $V_{ref}$ and fed back to the VCO to lock a frequency of the VCO in the frequency-locked voltage regulated loop.

In another embodiment of the disclosure, an integrated circuit chip includes a frequency-locked voltage regulated loop without an off-chip input reference component, such as a crystal oscillator, or other type of reference signal circuitry. The frequency-locked voltage regulated loop includes: a voltage controlled oscillator (VCO) that outputs a VCO signal having a frequency and a period; a frequency divider, connected to the VCO, that divides the frequency output of the VCO signal to generate a lower frequency and longer period, each longer period including 3 sequential timing signals, each sequential timing signal being based on a period of the VCO; a frequency-to-voltage converter (FVC), connected to the frequency divider, that converts the frequency divided VCO signal into an output voltage, $FVC_{OUT}$, during a $1^{st}$ timing period; an internal reference voltage, $V_{ref}$, connected to the FVC and a voltage regulator; and the voltage regulator, also being connected to the frequency divider, the FVC and the VCO, generating a control voltage, $VCO_{IN}$, that is fed back to the VCO in a $2^{nd}$ timing period to lock a frequency of the VCO in the frequency-locked voltage regulated loop.

BRIEF DESCRIPTION OF THE DRAWINGS

The embodiments herein will be better understood from the following detailed description with reference to the drawings, which are not necessarily drawn to scale and in which.

DETAILED DESCRIPTION

As stated above, there remains a need for an integrated circuit chip that includes a frequency-locked loop and does not require an off-chip reference component. In general, users of an integrated circuit chip prefer a minimum of off-chip components. Thus, users prefer an integrated circuit chip including a frequency-locked loop that does not require an external reference component such as a crystal oscillator, or other type of reference signal circuitry. In addition, an off-chip crystal oscillator, or other type of reference signal circuitry, can be a weak point in the security of the chip, allowing malfeasors to determine the reference frequency used by the chip to synchronize all internal signals. Furthermore, it may not be necessary for a clock source to provide a signal with an extremely precise and accurate frequency in a digital clock system; a stable frequency with less jitter may be sufficient.

Figure 3:
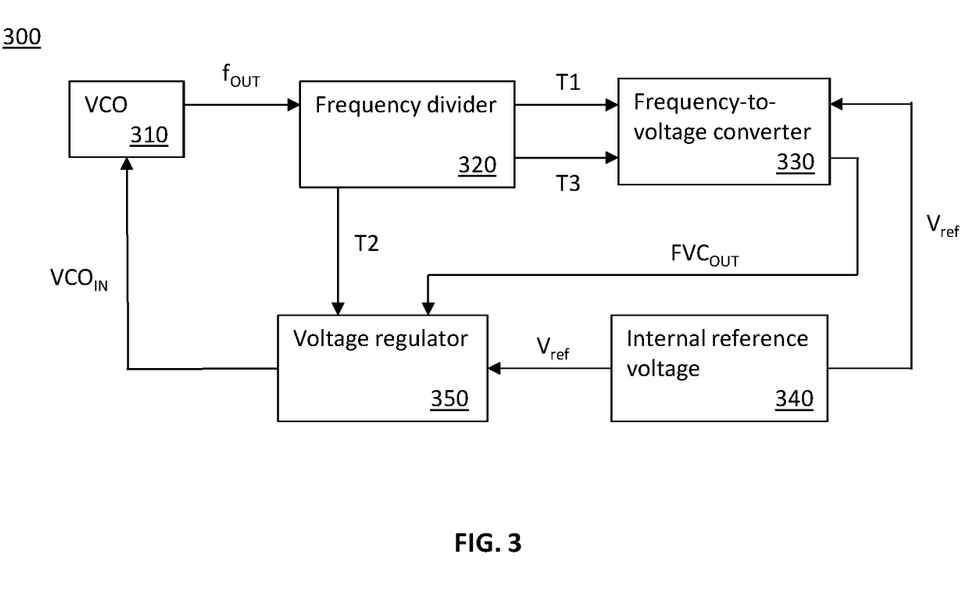
FIG. 3 is a schematic diagram illustrating a frequency-locked voltage regulated loop in embodiments herein.

Referring to FIG. 3, a schematic diagram illustrates a frequency-locked voltage regulated loop 300 that does not require an off-chip reference component. The frequency-locked voltage regulated loop may include: a voltage controlled oscillator (VCO), 310; a frequency divider, 320; a frequency-to-voltage converter (FVC) 330; an internal reference voltage, 340; and a voltage regulator 350.

The VCO 310 may receive a regulated control voltage, $VCO_{IN}$, from voltage regulator, 350, and output a frequency, $f_{OUT}$, which is based on the input regulated control voltage, $VCO_{IN}$. The VCO 310 may include any of a relaxation oscillator and a ring oscillator.

Figure 4A:
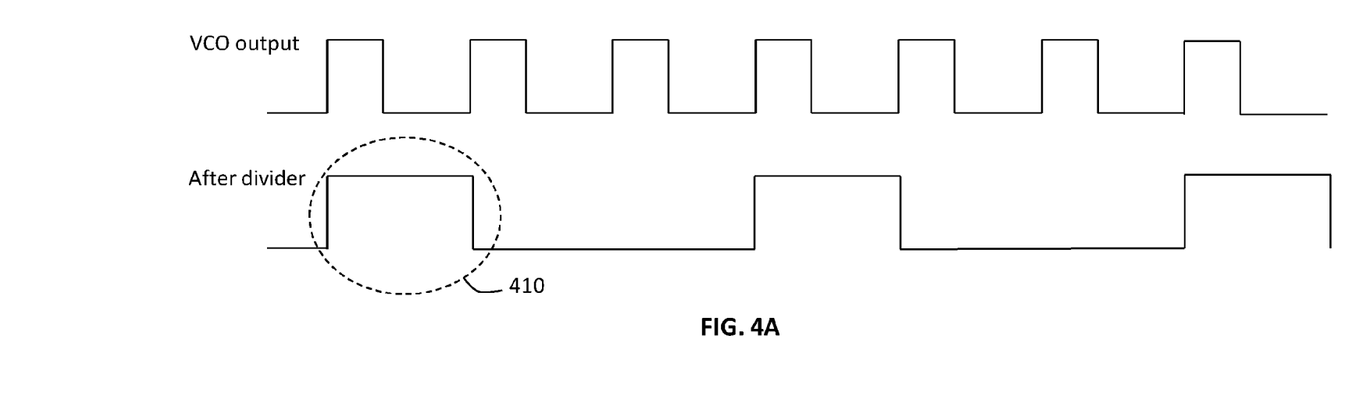
FIGS. 4A-4B are schematic diagrams illustrating the timing signal outputs of a frequency divider in a frequency-locked voltage regulated loop in embodiments herein.
Figure 4B:
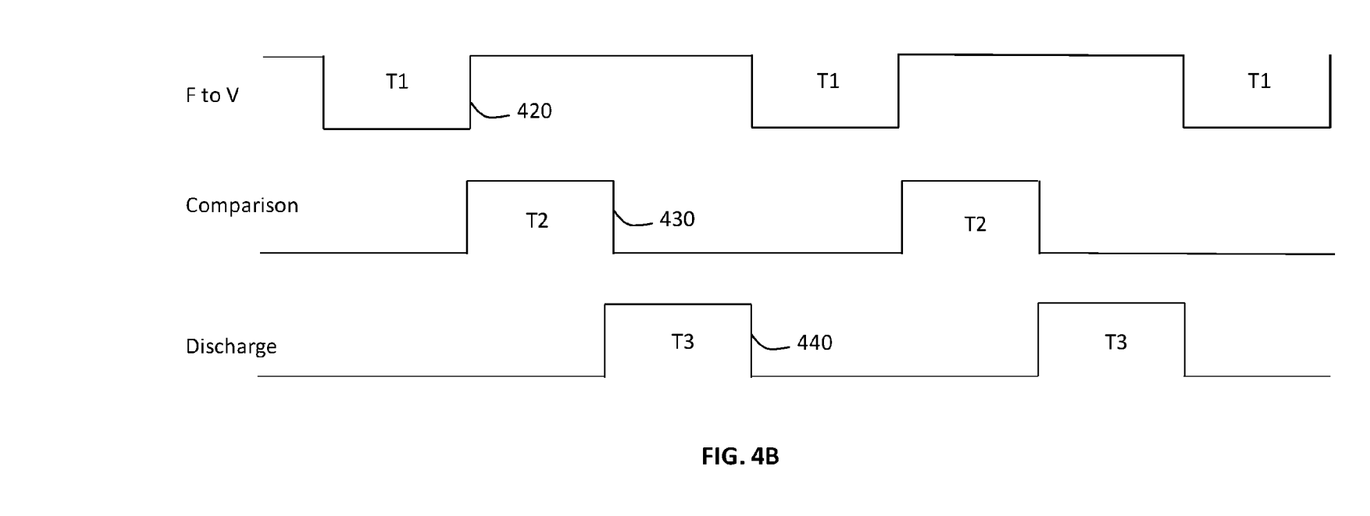

The frequency divider 320 receives $f_{OUT}$ from VCO 310 and has two functions: 1) generating an output signal whose duration is exactly proportional to the output period of the VCO, regardless of its duty cycle, as shown in 410 of FIG. 4A; and 2) generating three timing signals: T1 420, T2 430, and T3 440, each of which is based on the output signal whose duration is exactly proportional to the output period of the VCO and during which the sequential operations of frequency to voltage conversion, voltage comparison, and discharge of a timing capacitor may take place, respectively, in the frequency-locked voltage regulated loop 300, as shown in FIG. 4B. As an example, T1 may be an invert of the divided signal, whose duration is exactly proportional to the output period of the VCO; while T2 and T3 may be equal or non-equal divisions of the time difference between the period and the duration of the divided signal from the divider.

Figure 5:
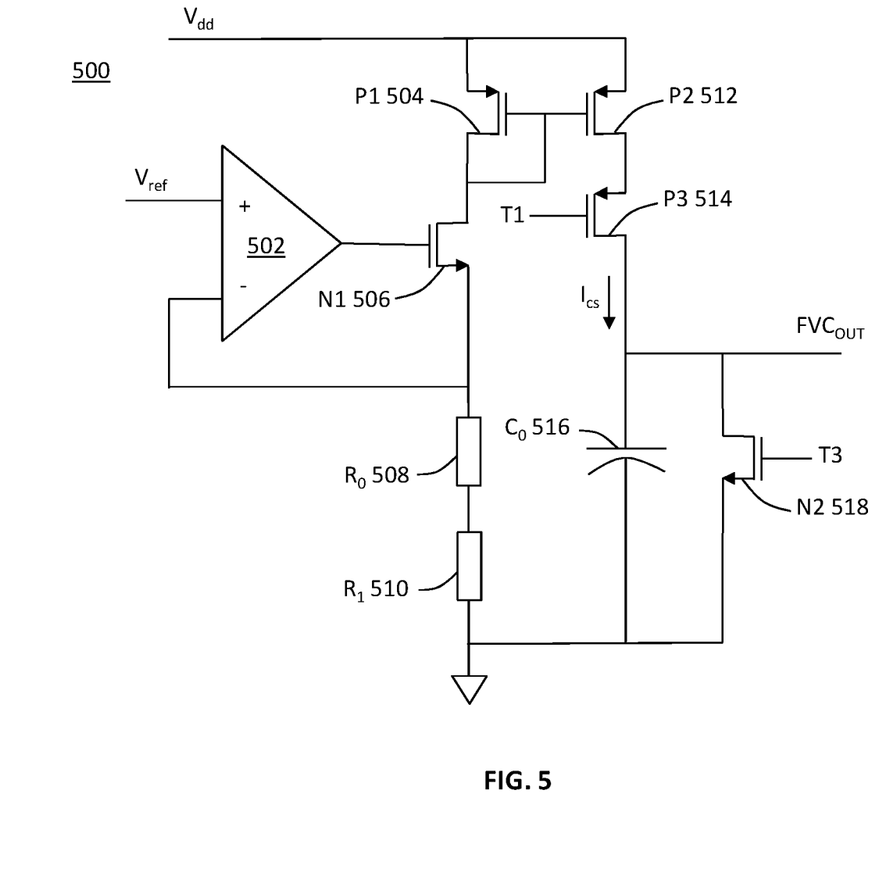
FIG. 5 is a schematic diagram illustrating a frequency-to-voltage converter (FVC) in a frequency-locked voltage regulated loop in embodiments herein.

Referring to FIG. 5, the frequency-to-voltage converter (FVC) circuit 500, corresponding to the FVC block 330 of FIG. 3, may include an accurate current source including: a high gain amplifier 502 that receives an accurate reference voltage, $V_{ref}$, from internal reference voltage, 340; a p-channel field effect transistor (P1), 504; an n-channel field effect transistor (N1), 506; and two accurate resistors, $R_0$ 508 and $R_1$ 510, with opposite temperature coefficients. The accurate current source provides a current, $I_{cs}$, through P1 equal to $V_{ref}/(R_0+R_1)$. The FVC 330 may also include: a current mirror formed by P1 504 and P2 512, the mirror rate is determined to allow $C_0$ 516 to be charged to about Vdd/2 during the T1 time period; a switching transistor, P3 514; and a timing capacitor, $C_0$ 516. When timing signal T1 is logic low, P3 514 is turned on, and the mirrored current $I_{cs}$ charges $C_0$; when T1 is logic high, the voltage on $C_0$ is determined by $I_{cs}$, the value of capacitance for $C_0$ and its time constant, and the period of the timing signal T1. Since, the mirrored current $I_{cs}$, the time constant and the capacitance value of $C_0$ are constants, the FVC 330 provides a voltage, $FVC_{OUT}$, on timing capacitor $C_0$ that varies directly with the output period and inversely with the output frequency of VCO 310.

Following the charging of timing capacitor $C_0$ to $FVC_{OUT}$, T1 is switched logic high, turning off the switching transistor, P3 514. Immediately thereafter, timing signal T2 is brought logic high, allowing $FVC_{OUT}$ on the timing capacitor $C_0$ to be sent to the voltage regulator 350 for comparison with the accurate reference voltage, $V_{ref}$, from internal reference voltage 340. After the comparison of $FVC_{OUT}$ with $V_{ref}$, timing capacitor $C_0$ is discharged during the period of timing signal T3 by N2 518.

The internal reference voltage 340 of the integrated circuit may include a bandgap voltage reference that produces an accurate fixed voltage regardless of power supply variations, temperature changes, and circuit loading from a device. The bandgap voltage reference may have an output voltage of about 1.25 V, close to the theoretical 1.22 eV bandgap of silicon at 0° K. The internal reference voltage 340 may be implemented by any of: a Brockaw bandgap reference; a linear voltage regulator, using an internal band gap reference, such as those used in the well-known LM317 and LM337; and other well known variations of bandgap voltage reference circuits.

Figure 6:
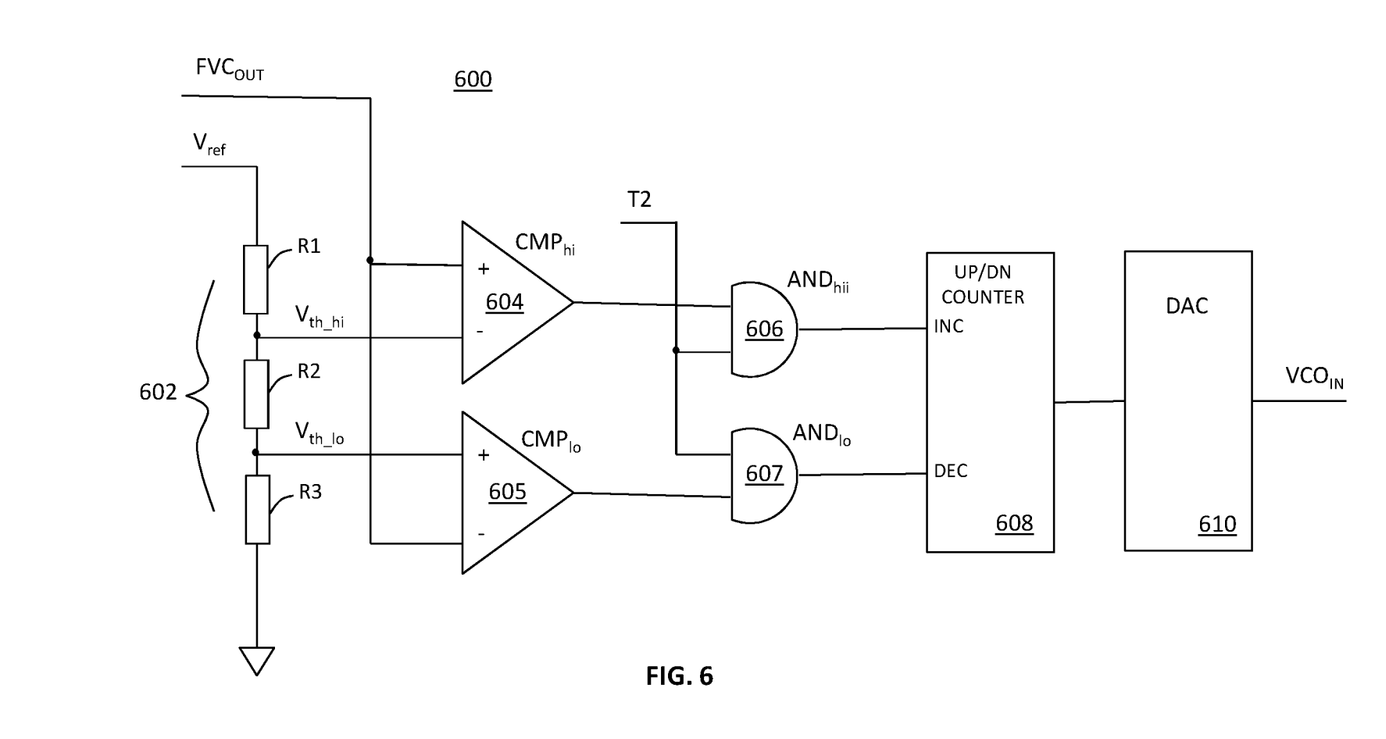
FIG. 6 is a schematic diagram illustrating a digital regulator in a frequency-locked voltage regulated loop in embodiments herein.
Figure 7:
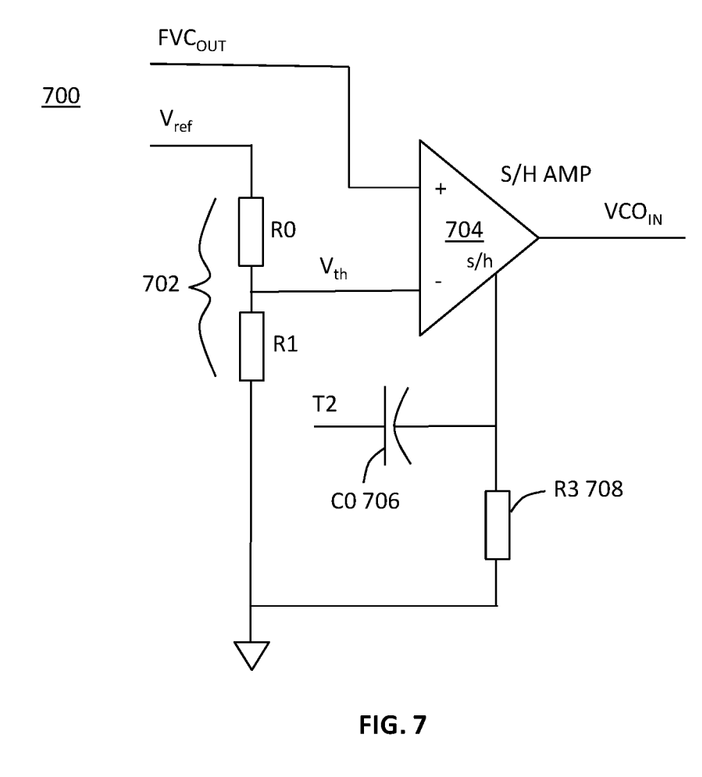
FIG. 7 is a schematic diagram illustrating an analog regulator in a frequency-locked voltage regulated loop in embodiments herein.

The voltage regulator 350 of the frequency-locked voltage regulated loop 300 may be implemented as a digital voltage regulator 600, as illustrated in FIG. 6, or as an analog voltage regulator 700, as illustrated in FIG. 7.

Referring to FIG. 6, the digital voltage regulator 600 may include: a voltage divider 602; two comparators, $CMP_{hi}$ 604 and $CMP_{lo}$ 605; two AND gates, $AND_{hi}$ 606 and $AND_{lo}$ 607; an up/down counter, 608; and a digital-to-analog converter (DAC) 610. The voltage divider 602 divides the accurate reference voltage, $V_{ref}$, from internal reference voltage 340 into a high threshold voltage, $V_{th\_hi}$, and a low threshold voltage, $V_{th\_lo}$. The high threshold voltage, $V_{th\_hi}$, is compared to $FVC_{OUT}$ from FVC 330, which varies inversely with the output frequency of VCO 310.

When $FVC_{OUT}$ is higher than the high threshold voltage, $V_{th\_hi}$, from voltage divider 602, the output frequency of VCO 310 is lower than expected and the output of voltage comparator $CMP_{hi}$ 604 goes logic high. This logic high is input to $AND_{hi}$ 606 and when timing signal T2 changes from logic low to logic high, the output of $AND_{hi}$ 606 goes logic high and is applied to the increase (INC) input of up/down counter 608. The increased count of the up/down counter 608 is then applied to digital-to-analog converter 610 to output a higher control voltage, $VCO_{IN}$, which is fed back to VCO 310 of the frequency-locked voltage regulated loop 300 to produce a higher output frequency, $f_{OUT}$, for VCO 310.

When $FVC_{OUT}$ is lower than the low threshold voltage, $V_{th\_lo}$, from voltage divider 602, the output frequency of VCO 310 is higher than expected and the output of voltage comparator $CMP_{hi}$ 604 goes logic high. This logic high is input to $AND_{lo}$ 607 and when timing signal T2 changes from logic low to logic high, the output of $AND_{lo}$ 607 goes logic high and is applied to the decrease (DE) input of up/down counter 608. The decreased count of up/down counter 608 is then applied to the digital-to-analog converter 610 to produce control voltage, $VCO_{IN}$, which is fed back to VCO 310 of the frequency-locked voltage regulated loop 300 to produce a lower output frequency, $f_{OUT}$, for VCO 310.

If $FVC_{OUT}$ is between that of $V_{th\_hi}$ and $V_{th\_lo}$, no change is made to the up/down counter 610 and the control $VCO_{IN}$ signal fed back to VCO 310 from the digital-to-analog converter 610 of the digital voltage regulator 600 remains unchanged.

Referring to FIG. 7, the analog voltage regulator 700 may include: a voltage divider 702, including resistors $R_0$ and $R_1$ that generate a threshold voltage, $V_{th}$, from the input reference voltage, $V_{ref}$, of internal reference voltage 340; a sample/hold amplifier 704; and a differential circuit that triggers the sample/hold amplifier 704 based on the input of timing signal T2. The sample/hold amplifier 704 may receive $FVC_{OUT}$ from FVC 330 at the non-inverting input, and $V_{th}$ from the voltage divider 702 receiving the input reference voltage, $V_{ref}$ at the inverting input. When the timing signal T2 transitions from logic low to logic high, a positive pulse is generated, which inputs a hold command to the sample/hold amplifier 704. The sample/hold amplifier 704 effects regulation by making the input difference between $FVC_{OUT}$ and $V_{th}$ close to zero with a sample/hold amplifier output of control voltage $VCO_{IN}$ that is fed back to VCO 310 from the analog voltage regulator 700. The sampled voltages and the resulting sample/hold amplifier output of control voltage $VCO_{IN}$ are updated at the next rising edge of timing signal T2 in the analog voltage regulator 700.

The above-described structures can be included within integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated).

In the drawings herein, the same identification numeral identifies the same or similar item. The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit, comprising:
    a frequency-locked voltage regulated loop, further comprising:
        a voltage controlled oscillator (VCO) that outputs a VCO signal;
        a frequency divider, connected to the VCO, that generates sequential timing signals based on a period of the VCO signal from a frequency divided VCO signal;
        a frequency-to-voltage converter (FVC), connected to the frequency divider, that converts the frequency divided VCO signal into an output voltage, $FVC_{OUT}$, during a first timing period;
        an internal reference voltage, $V_{ref}$ connected to the FVC and a voltage regulator; and
        the voltage regulator, connected to the frequency divider, the FVC, the internal reference voltage, and the VCO generating a control voltage, $VCO_{IN}$, that is fed back to the VCO in a second timing period to lock a frequency of the VCO in the frequency-locked voltage regulated loop.

2. The integrated circuit of claim 1, the VCO further comprising any one of a relaxation oscillator and a ring oscillator.

3. The integrated circuit of claim 1, the frequency divider dividing a frequency output of the VCO signal to generate a lower frequency and longer period, each the longer period including 3 sequential timing signals, each sequential timing signal being based on a period of the VCO signal.

4. The 3 sequential timing signals of claim 3 comprising:
    a first timing signal during which the FVC charges a timing capacitor for the period of the VCO signal to produce $FVC_{OUT}$, which is inversely proportional to a frequency of the VCO signal;
    a second timing signal during which the voltage regulator generates a threshold voltage based on the internal reference voltage, compares the threshold voltage to the $FVC_{OUT}$, and generates control voltage, $VCO_{IN}$, based on a difference between the threshold voltage and the $FVC_{OUT}$; and a third timing signal during which the timing capacitor of the FVC is discharged.

5. The integrated circuit of claim 1, the FVC including an accurate current source based on an input of $V_{ref}$ to a control current of a current mirror, the accurate current source charging a timing capacitor to an output voltage, $FVC_{OUT}$, during a first timing period that is based on a period of the VCO signal and inversely proportion to a frequency of the VCO signal.

6. The integrated circuit of claim 1, the internal reference voltage, $V_{ref}$, including a silicon bandgap voltage reference of about 1.25 V.

7. The integrated circuit of claim 1, the voltage regulator further comprising a digital regulator further comprising a voltage divider that generates from the internal reference voltage, $V_{ref}$, high and low threshold voltages, whose respective outputs are fed to an up/down counter that in turn sends its count to a digital-to-analog converter, which outputs the control voltage, $VCO_{IN}$, that is fed back to the VCO.

8. The integrated circuit of claim 1, the voltage regulator further comprising an analog regulator further comprising a voltage divider that generates from the internal reference voltage, $V_{ref}$, a threshold voltage, $V_{th}$, that is fed to an inverting input of an amplifier, while $FVC_{OUT}$ is connected to a non-inverting input of the amplifier, the amplifier outputting the control voltage, $VCO_{IN}$, that is fed back to the VCO.

9. An integrated circuit, comprising:
a frequency-locked voltage regulated loop, further comprising:
a voltage controlled oscillator (VCO) that outputs a VCO signal;
a frequency divider, connected to the VCO, that generates a frequency divided VCO signal;
a frequency-to-voltage converter (FVC), connected to the frequency divider, that converts the lower frequency divided VCO signal into an output voltage, $FVC_{OUT}$;
an internal reference voltage, $V_{ref}$, connected to the FVC and a voltage regulator; and
the voltage regulator, connected to the frequency divider, the FVC, the internal reference voltage and the VCO, generating a control voltage, $VCO_{IN}$, that is based on a difference between $FVC_{OUT}$ and $V_{ref}$ and fed back to the VCO to lock a frequency of the VCO in the frequency-locked voltage regulated loop.

10. The integrated circuit of claim 9, the frequency divider dividing a frequency output of the VCO signal to generate a lower frequency and longer period, each the longer period including 3 sequential timing signals, each sequential timing signal being based on a period of the VCO signal.

11. The 3 sequential timing signals of claim 10 comprising:
a first timing signal during which the FVC charges a timing capacitor for the period of the VCO signal to produce $FVC_{OUT}$, which is inversely proportional to a frequency of the VCO signal;
a second timing signal during which the voltage regulator generates a threshold voltage based on the internal reference voltage, compares the threshold voltage to the $FVC_{OUT}$, and generates control voltage, $VCO_{IN}$, based on a difference between the threshold voltage and the $FVC_{OUT}$; and
a third timing signal during which the timing capacitor of the FVC is discharged.

12. The integrated circuit of claim 9, the FVC including an accurate current source based on an input of $V_{ref}$ to a control current of a current mirror, the accurate current source charging a timing capacitor to an output voltage, $FVC_{OUT}$, during a first timing period that is based on a period of the VCO signal and inversely proportion to a frequency of the VCO signal.

13. The integrated circuit of claim 9, the internal reference voltage, $V_{ref}$, including a silicon bandgap voltage reference of about 1.25 V.

14. The integrated circuit of claim 9, the voltage regulator further comprising one of:
a digital regulator further comprising a voltage divider that generates from the internal reference voltage, $V_{ref}$, high and low threshold voltages, whose respective outputs are fed to an up/down counter that in turn sends its count to a digital-to-analog converter, which outputs a control voltage, $VCO_{IN}$, that is fed back to the VCO; and
an analog regulator further comprising a voltage divider that generates from the internal reference voltage, $V_{ref}$, a threshold voltage, $V_{th}$, that is fed to an inverting input of an amplifier, while $FVC_{OUT}$ is connected to a non-inverting input of the amplifier, the amplifier outputting the control voltage, $VCO_{IN}$, that is fed back to the VCO.

15. An integrated circuit, comprising:
a frequency-locked voltage regulated loop, further comprising:
a voltage controlled oscillator (VCO) that outputs a VCO signal having a frequency and a period;
a frequency divider, connected to the VCO, that divides the frequency of the VCO signal to generate a lower frequency and longer period, each the longer period including 3 sequential timing signals, each sequential timing signal being based on a period of the VCO;
a frequency-to-voltage converter (FVC), connected to the frequency divider, that converts the frequency divided VCO signal into an output voltage, $FVC_{OUT}$, during a first timing period;
an internal reference voltage, $V_{ref}$, connected to the FVC and a voltage regulator; and
the voltage regulator, connected to the frequency divider, the FVC, the internal reference voltage and the VCO, generating a control voltage, $VCO_{IN}$, that is fed back to the VCO in a second timing period to lock a frequency of the VCO in the frequency-locked voltage regulated loop.

16. The integrated circuit of claim 15, the 3 sequential timing signals comprising:
a first timing signal during which the FVC charges a timing capacitor for the period of the VCO signal to produce $FVC_{OUT}$, which is inversely proportional to a frequency of the VCO signal;
a second timing signal during which the voltage regulator generates a threshold voltage based on the internal reference voltage, compares the threshold voltage to the $FVC_{OUT}$, and generates control voltage, $VCO_{IN}$, based on a difference between the threshold voltage and the $FVC_{OUT}$; and
a third timing signal during which the timing capacitor of the FVC is discharged.

17. The integrated circuit of claim 15, the FVC including an accurate current source based on an input of $V_{ref}$ to a control current of a current mirror, the accurate current source charging a timing capacitor to an output voltage, $FVC_{OUT}$, during a first timing period that is based on a period of the VCO signal and inversely proportion to a frequency of the VCO signal.

18. The integrated circuit of claim 15, the internal reference voltage, $V_{ref}$, including a silicon bandgap voltage reference of about 1.25 V.

19. The integrated circuit of claim 15, the voltage regulator comprising a digital regulator further comprising a voltage divider that generates from the internal reference voltage, $V_{ref}$, high and low threshold voltages, whose respective outputs are fed to an up/down counter that in turn sends its count to a digital-to-analog converter, which outputs the control voltage, $VCO_{IN}$, that is fed back to the VCO.

20. The integrated circuit of claim 15, the voltage regulator comprising an analog regulator further comprising a voltage divider that generates from the internal reference voltage, $V_{ref}$, a threshold voltage, $V_{th}$, that is fed to an inverting input of an amplifier, while $FVC_{OUT}$ is connected to a non-inverting input of the amplifier, the amplifier outputting the control voltage, $VCO_{IN}$, that is fed back to the VCO.

* * * * *